United States Patent
Kawahara (10) Patent No.: US 10,655,230 B2
(45) Date of Patent: May 19, 2020

(54) COATED CUTTING TOOL (71) Applicant: TUNGALOY CORPORATION, Fukushima (JP)

(72) Inventor: Keiya Kawahara, Iwaki (JP)

(73) Assignee: TUNGALOY CORPORATION, Iwaki-shi, Fukushima (JP)

( * ) Notice: Subject to any disclaimer, the term of this patent is extended or adjusted under 35 U.S.C. 154(b) by 105 days.

(21) Appl. No.: 15/958,197

(22) Filed: Apr. 20, 2018

(65) Prior Publication Data

US 2018/0305823 A1 Oct. 25, 2018

(30) Foreign Application Priority Data

Apr. 21, 2017 (JP) ................. 2017-084074

(51) Int. Cl.
| | |
|---|---|
| *B23B 27/14* | (2006.01) |
| *C23C 28/04* | (2006.01) |
| *C23C 16/34* | (2006.01) |
| *C23C 16/40* | (2006.01) |
| *C23C 30/00* | (2006.01) |

(Continued)

(52) U.S. Cl.
CPC ........ *C23C 28/044* (2013.01); *C23C 16/0272* (2013.01); *C23C 16/308* (2013.01); *C23C 16/34* (2013.01); *C23C 16/36* (2013.01); *C23C 16/403* (2013.01); *C23C 28/042* (2013.01); *C23C 28/048* (2013.01); *C23C 30/005* (2013.01); *B23B 27/148* (2013.01)

(58) Field of Classification Search
USPC .......... 51/307, 309; 428/216, 336, 698, 701, 428/702
See application file for complete search history.

(56) References Cited

U.S. PATENT DOCUMENTS

| | | | |
|---|---|---|---|
| 2008/0292905 A1 | 11/2008 | Okada et al. | |
| 2009/0297835 A1 | 12/2009 | Okada et al. | |

(Continued)

FOREIGN PATENT DOCUMENTS

| | | |
|---|---|---|
| JP | 4739235 B2 | 8/2011 |
| JP | 4739236 B2 | 8/2011 |

*Primary Examiner* — Archene A Turner
(74) *Attorney, Agent, or Firm* — Studebaker & Brackett PC (57) ABSTRACT

A coated cutting tool comprising a substrate and a coating layer formed on a surface of the substrate, the coated cutting tool having a rake surface and a flank, in which the coating layer includes an α-type aluminum oxide layer, wherein: the α-type aluminum oxide layer has, on an opposite side to the substrate, a first interface, being the rake surface or a surface substantially parallel to the rake surface, a second interface, being the flank or a surface substantially parallel to the flank, and an intersecting edge between the first interface and the second interface; and a residual stress value (unit: GPa) measured near each of the first and second interfaces increases continuously or stepwise as a measurement position for the residual stress value becomes distant from the intersecting edge with distances of 10 μm, 50 μm, 100 μm, 150 μm and 200 μm.

(In the above formulae, σ11 denotes a residual stress value (MPa) in a direction parallel to the intersecting edge, σ22 denotes a residual stress value (MPa) in a direction orthogonal to the intersecting edge, and each of the residual stress values is a value measured by a 2D method.)

20 Claims, 1 Drawing Sheet

(51) Int. Cl.
*C23C 16/02* (2006.01)
*C23C 16/30* (2006.01)
*C23C 16/36* (2006.01)

(56) References Cited

U.S. PATENT DOCUMENTS

2012/0282049 A1 11/2012 Okada et al.
2016/0175940 A1* 6/2016 Lindahl ................. B23B 27/148
428/141

* cited by examiner

COATED CUTTING TOOL

TECHNICAL FIELD

The present invention relates to a coated cutting tool.

BACKGROUND ART

A conventional coated cutting tool used for the cutting of steel, cast iron, etc., is a coated cutting tool which is obtained by depositing, via chemical vapor deposition, a coating layer with a total thickness of from 3 μm or more to 20 μm or less on a surface of a substrate consisting of a cemented carbide. A known example of the above coating layer is a coating layer consisting of a single layer of one kind selected from the group consisting of a Ti carbide, a Ti nitride, a Ti carbonitride, a Ti carboxide, a Ti carboxynitride, and aluminum oxide, or consisting of multiple layers of two or more kinds selected therefrom.

JP4739235 B discloses a coated cutting tool comprising a substrate and a coating formed on the substrate, wherein: the coating includes a first coating comprised of TiCN and a second coating comprised of α-type $Al_2O_3$; the first coating has tensile stress S1 and the second coating has compressive stress S2; and the tensile stress S1 and the compressive stress S2 satisfy the relationship of 400 MPa≤|S2−S1|≤3,500 MPa.

JP4739236 B discloses a coated cutting tool comprising a substrate and a coating formed on the substrate, wherein: the coating includes a first coating comprised of TiCN and a second coating comprised of α-type $Al_2O_3$; the first coating has tensile stress or is released from tensile stress to substantially have no stress; the second coating has compressive stress S1 on a rake surface and tensile stress S2 on a flank; and the compressive stress S1 and the tensile stress S2 satisfy the relationship of 441 MPa≤|S1−S2|≤3,500 MPa.

SUMMARY OF THE INVENTION

Technical Problem

An increase in speed, feed and depth of cut has become more conspicuous in cutting in recent times. Thus, a tool may often fracture based on chipping due to a load applied onto the tool during machining.

Based on such background, each of the tools disclosed in JP4739235 B and JP4739236 B has insufficient fracture resistance under cutting conditions which place a large load on a coated cutting tool, and the life thereof is therefore required to be further improved.

The present invention has been made in order to solve this problem, and an object of the present invention is to provide a coated cutting tool which has excellent wear resistance and fracture resistance and thereby allows the tool life to be extended.

Solution to Problem

The present inventor has conducted studies regarding extending the tool life of a coated cutting tool from the above-described perspective and has then found that the following configurations, including optimizing the residual stress of an α-type aluminum oxide layer, suppress the occurrence of chipping without a reduction in wear resistance, and this allows the fracture resistance of the tool to be improved, and has further found that, as a result, the tool life can be extended, and this has led to the completion of the present invention.

Namely, the present invention is as set forth below:

[1] A coated cutting tool comprising a substrate and a coating layer formed on a surface of the substrate, the coated cutting tool having a rake surface and a flank, in which the coating layer includes an α-type aluminum oxide layer, wherein:
the α-type aluminum oxide layer has, on an opposite side to the substrate, a first interface, being the rake surface or a surface substantially parallel to the rake surface, a second interface, being the flank or a surface substantially parallel to the flank, and an intersecting edge between the first interface and the second interface; and
the α-type aluminum oxide layer further satisfies conditions represented by formulae (1) and (2) below.
(1) A residual stress value σr (unit: GPa) measured in the α-type aluminum oxide layer increases continuously or stepwise as a measurement position becomes distant from the intersecting edge along the first interface with distances of 10 μm, 50 μm, 100 μm, 150 μm and 200 μm.
(2) A residual stress value σf (unit: GPa) measured in the α-type aluminum oxide layer increases continuously or stepwise as a measurement position becomes distant from the intersecting edge along the second interface with distances of 10 μm, 50 μm, 100 μm, 150 μm and 200 μm.

[2] The coated cutting tool according to [1], wherein the α-type aluminum oxide layer satisfies a condition represented by formula (A) below.

$$Sf > Sr \quad (A)$$

(In the formula above, Sf denotes a residual stress value (unit: GPa) measured, in the α-type aluminum oxide layer, at a position 100 μm from the intersecting edge along the second interface, and Sr denotes a residual stress value (unit: GPa) measured, in the α-type aluminum oxide layer, at a position 100 μm from the intersecting edge along the first interface.)

[3] The coated cutting tool according to [1] or [2], wherein the α-type aluminum oxide layer satisfies a condition represented by formula (B) below.

$$-0.800 \leq Sr \leq 0.300 \quad (B)$$

(In the formula above, Sr denotes a residual stress value (unit: GPa) measured, in the α-type aluminum oxide layer, at a position 100 μm from the intersecting edge along the first interface.)

[4] The coated cutting tool according to any one of [1] to [3], wherein the α-type aluminum oxide layer satisfies a condition represented by formula (C) below.

$$-0.600 \leq Sf \leq 0.400 \quad (C)$$

(In the formula above, Sf denotes a residual stress value (unit: GPa) measured, in the α-type aluminum oxide layer, at a position 100 μm from the intersecting edge along the second interface.)

[5] The coated cutting tool according to any one of [1] to [4], wherein an average thickness of the α-type aluminum oxide layer is from 1.0 μm or more to 15.0 μm or less.

[6] The coated cutting tool according to any one of [1] to [5], wherein:
the coating layer comprises a titanium carbonitride layer, being comprised of titanium carbonitride, between the substrate and the α-type aluminum oxide layer; and
an average thickness of the titanium carbonitride layer is from 1.0 μm or more to 20.0 μm or less.

[7] The coated cutting tool according to [6], wherein the coating layer comprises, between the titanium carbonitride layer and the α-type aluminum oxide layer, an intermediate layer comprising a compound of at least one kind selected from the group consisting of a Ti carboxide, a Ti oxynitride and a Ti carboxynitride.

[8] The coated cutting tool according to [7], wherein an average thickness of the intermediate layer is from 0.1 μm or more to 1.5 μm or less.

[9] The coated cutting tool according to any one of [1] to [8], wherein an average thickness of the coating layer is from 3.0 μm or more to 30.0 μm or less.

[10] The coated cutting tool according to any one of [1] to [9], wherein:

the coating layer comprises a titanium nitride layer, being comprised of titanium nitride, as an outermost layer on a surface of the α-type aluminum oxide layer; and an average thickness of the outermost layer is from 0.1 μm or more to 1.0 μm or less.

[11] The coated cutting tool according to any one of [1] to [10], wherein the substrate is any of a cemented carbide, cermet, ceramics and a sintered body containing cubic boron nitride.

The present invention can provide a coated cutting tool which has excellent wear resistance and fracture resistance and thereby allows the tool life to be extended.

DESCRIPTION OF EMBODIMENTS

An embodiment for carrying out the present invention (hereinafter simply referred to as the "present embodiment") will hereinafter be described in detail. However, the present invention is not limited to the present embodiment below. Various modifications may be made to the present invention without departing from the gist of the invention.

The coated cutting tool according to the present embodiment is a coated cutting tool comprising a substrate and a coating layer formed on a surface of the substrate, the coated cutting tool having a rake surface and a flank, in which the coating layer includes an α-type aluminum oxide layer, wherein: the α-type aluminum oxide layer has, on a side opposite to the substrate, a first interface, being the rake surface or a surface substantially parallel to the rake surface, a second interface, being the flank or a surface substantially parallel to the flank, and an intersecting edge between the first interface and the second interface; and the α-type aluminum oxide layer satisfies conditions represented by formulae (1) and (2) below. The term "substantially parallel" in the specification indicates that an angle formed by the surface direction of the rake surface and the surface direction of the first interface is from 0° to 1° and also indicates that an angle formed by the surface direction of the flank and the surface direction of the second interface is from 0° to 1°.

(1) A residual stress value σr (unit: GPa) increases continuously or stepwise as a measurement position becomes distant from the intersecting edge along the first interface with distances of 10 μm, 50 μm, 100 μm, 150 μm and 200 μm.
(2) A residual stress value σf (unit: GPa) increases continuously or stepwise as a measurement position becomes distant from the intersecting edge along the second interface with distances of 10 μm, 50 μm, 100 μm, 150 μm and 200 μm.

It should be noted that the residual stress values in the specification are measured using a 2D method (a multi-axial stress measurement method/a full Debye ring fitting method).

The coated cutting tool of the present embodiment has excellent wear resistance and fracture resistance through the above-described optimization of the residual stress of the α-type aluminum oxide layer. The factors therefor can be considered to be those set forth below but are not limited thereto.

When the residual stress values σr and σf each increase continuously or stepwise, firstly, the stress on the side nearest to the cutting edge is the minimum stress, and this can suppress the progress of cracking; at the same time, chipping which occurs when a chip comes into contact with the intersecting edge between the rake surface and the flank can be reduced. As a result, the fracture resistance of the coated cutting tool is improved. Further, the stress on the side farthest to the cutting edge is the maximum stress, and this reduces cracking generated through blasting, etc., thereby preventing cracks from being continuous with one another during machining, so that the progress of wear due to the falling of particles of the coating layer can be suppressed. As a result, the wear resistance of the coated cutting tool is improved.

Figure 1:
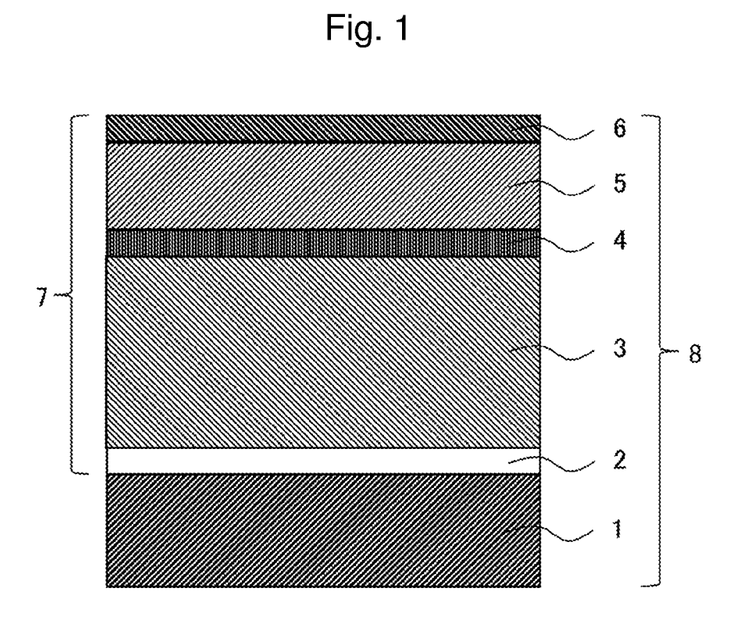
FIG. 1 is a schematic cross-sectional view partially showing an example of a coated cutting tool according to the present invention.

FIG. 1 is a schematic cross-sectional view partially showing an example of a coated cutting tool according to the present embodiment. A coated cutting tool 8 comprises a substrate 1 and a coating layer 7 formed on a surface of the substrate 1. In the coating layer 7, a lowermost layer 2, a titanium carbonitride layer 3, an intermediate layer 4, an α-type aluminum oxide layer 5 and an outermost layer 6 are laminated in this order from the substrate side.

A coated cutting tool according to the present embodiment comprises a substrate and a coating layer formed on a surface of the substrate. The coated cutting tool has a rake surface and a flank. Specific examples of types of the coated cutting tool include an indexable cutting insert for milling or turning, a drill and an end mill.

The substrate in the present embodiment is not particularly limited, as long as it is used as a substrate for the coated cutting tool. Examples of such substrate include a cemented carbide, cermet, ceramic, a sintered body containing cubic boron nitride, a diamond sintered body and high-speed steel. From among the above examples, the substrate is preferably comprised of any of a cemented carbide, cermet, ceramics and a sintered body containing cubic boron nitride, as this provides excellent wear resistance and fracture resistance. From the same perspective, the substrate is more preferably comprised of a cemented carbide.

It should be noted that the surface of the substrate may be modified. For instance, when the substrate is comprised of a cemented carbide, a β-free layer may be formed on the surface thereof, and when the substrate is comprised of cermet, a hardened layer may be formed on the surface thereof. The operation and effects of the present invention are still provided, even if the substrate surface has been modified in this way.

The average thickness of the coating layer in the present embodiment is preferably from 3.0 μm or more to 30.0 μm or less. If the average thickness is 3.0 μm or more, this indicates the tendency of the wear resistance to be further improved, and, if such average thickness is 30.0 μm or less, this indicates the tendency of the adhesion with the substrate of the coating layer and the fracture resistance to be further improved. From the same perspective, the average thickness of the coating layer is more preferably from 5.0 μm or more to 27.0 μm or less, and is further preferably from 9.0 μm or more to 25.0 μm or less.

The coating layer of the present embodiment includes at least one α-type aluminum oxide layer. In this α-type aluminum oxide layer, when the residual stress values σr and σf of the coated cutting tool each increase continuously or stepwise, firstly, the stress on the side nearest to the cutting edge is the minimum stress, and this can suppress the progress of cracking; at the same time, chipping which occurs when a chip comes into contact with the intersecting edge between the rake surface and the flank can be reduced. As a result, the fracture resistance of the coated cutting tool is improved. Further, the stress on the side farthest to the cutting edge is the maximum stress, and this reduces cracking generated through blasting, etc., thereby preventing cracks from being continuous with one another during machining, so that the progress of wear due to the falling of particles of the coating layer can be suppressed. As a result, the wear resistance of the coated cutting tool is improved. The term "continuous increase" in this specification indicates that the residual stress values σr and σf each consistently increase as a measurement position for the residual stress value becomes distant from the intersecting edge with distances of 10 μm, 50 μm, 100 μm, 150 μm and 200 μm. The term "stepwise increase" in the specification indicates that, when regarding the residual stress values σr and σf at measurement positions 10 μm from the intersecting edge as being denoted by S1(10) and S2(10), regarding the residual stress values σr and σf at measurement positions 50 μm from the intersecting edge as being denoted by S1(50) and S2(50), regarding the residual stress values σr and σf at measurement positions 100 μm from the intersecting edge as being denoted by S1(100) and S2(100), regarding the residual stress values σr and σf at measurement positions 150 μm from the intersecting edge as being denoted by S1(150) and S2(150), and regarding the residual stress values σr and σf at measurement positions 200 μm from the intersecting edge as being denoted by S1(200) and S2(200), any one through three values, from among the following values: S1(50)-S1(10) (or S2(50)-S2(10)); S1(100)-S1(50) (or S2(100)-S2(50)); S1(150)-S1(100) (or S2(150)-S2(100)); and S1(200)-S1(150) (or S2(200)-S2(150)), are each from −0.020 GPa or higher to 0.020 GPa or lower and the remaining one or more values is(are each) over 0.020 GPa.

The α-type aluminum oxide layer of the present embodiment satisfies a condition represented by formula (A) below.

$$Sf > Sr \quad (A)$$

Herein, in formula (A) above, Sf denotes a residual stress value (unit: GPa) measured, in the α-type aluminum oxide layer, at a position 100 μm from the intersecting edge along the second interface. Sf is, for example, a residual stress value, measured near the second interface, in a direction parallel to the intersecting edge. In formula (A) above, Sr denotes a residual stress value (unit: GPa) measured, in the α-type aluminum oxide layer, at a position 100 μm from the intersecting edge along the first interface. Sr is, for example, a residual stress value, measured near the first interface, in the direction parallel to the intersecting edge.

If the relationship represented by formula (A) above, with regard to the rake surface and the flank, fracturing starting from the rake surface is suppressed, and this can reduce boundary damage. This indicates the tendency of the fracture resistance to be further improved, thereby leading to more excellent balance between wear resistance and fracture resistance. This results in the tendency of the tool life of the coated cutting tool to be extended.

The α-type aluminum oxide layer of the present embodiment preferably satisfies a condition represented by formula (B) below.

$$-0.800 \leq Sr \leq 0.300 \quad (B)$$

Herein, in formula (B) above, Sr has the same definition as Sr in formula (A) above.

If Sr is −0.800 GPa or higher, this indicates the tendency of the wear resistance of the coated cutting tool to be further improved as the progress of crater wear due to the falling of particles can be suppressed. Meanwhile, if Sr is 0.300 GPa or lower, this indicates the tendency of the fracture resistance of the coated cutting tool to be further improved as cracking generated during cutting can be prevented from reaching toward the substrate. From the same perspective, Sr is more preferably from −0.700 GPa or higher to 0.100 GPa or lower, and is further preferably from −0.700 GPa or higher to −0.100 GPa or lower.

The α-type aluminum oxide layer of the present embodiment preferably satisfies a condition represented by formula (C) below.

$$-0.600 \leq Sf \leq 0.400 \quad (C)$$

Herein, in formula (C) above, Sf has the same definition as Sf in formula (A) above.

If Sf is −0.600 GPa or higher, this indicates the tendency of the wear resistance of the coated cutting tool to be further improved as the progress of wear due to the falling of particles can be suppressed. Meanwhile, if Sf is 0.400 GPa or lower, this indicates the tendency of the fracture resistance of the coated cutting tool to be further improved as boundary damage can be reduced. From the same perspective, Sf is more preferably from −0.500 GPa or higher to 0.200 GPa or lower, and is further preferably from −0.500 GPa or higher to 0 GPa or lower.

The residual stress values (the residual stress values σr, σf, Sr and Sf) in the α-type aluminum oxide layer of the present embodiment are measured using a 2D method (a multi-axial stress measurement method/a full Debye ring fitting method), as described above. The measurement of residual stress values of the α-type aluminum oxide layer employs a peak intensity for a (116) plane in X-ray diffraction. As to the conditions for X-ray diffraction measurement, Cu—Kα radiation with 0.05 mmφ is used as a radiation source for X-rays, radiation is performed under the condition of an output of 50 kV, 1.0 mA, whereby residual stress values are measured. Each of the residual stress values is obtained by measuring the α-type aluminum oxide layer at a position at most 200 μm from the intersecting edge along the first interface or the second interface. At this time, the respective residual stress values at five respective measurement positions, in the α-type aluminum oxide layer, 10 μm, 50 μm, 100 μm, 150 μm and 200 μm from the intersecting edge, are measured by the 2D method. The residual stress value at each measurement position can be obtained by calculating the arithmetic mean of the residual stresses at three points.

The average thickness of the α-type aluminum oxide layer of the present embodiment is preferably from 1.0 μm or more to 15.0 μm or less. If the average thickness of the α-type aluminum oxide layer is 1.0 μm or more, this indicates the tendency of the crater wear resistance in the rake surface of the coated cutting tool to be further improved, and, if such average thickness is 15.0 μm or less, this indicates the tendency of the fracture resistance of the coated cutting tool to be further improved as the peeling of the coating layer is further suppressed. From the same perspective, the average thickness of the α-type aluminum oxide layer is more preferably from 1.5 μm or more to 12.0 μm or less, and is further preferably from 3.0 μm or more to 10.0 μm or less.

The coating layer of the present embodiment preferably comprises a titanium carbonitride layer, being comprised of titanium carbonitride, between the substrate and the α-type aluminum oxide layer because this leads to a further improvement of wear resistance. The average thickness of the titanium carbonitride layer of the present embodiment is preferably from 1.0 μm or more to 20.0 μm or less. If the average thickness of the titanium carbonitride layer is 1.0 μm or more, this indicates the tendency of the wear resistance of the coated cutting tool to be further improved, and, if such average thickness is 20.0 μm or less, this indicates the tendency of the fracture resistance of the coated cutting tool to be further improved as the peeling of the coating layer is further suppressed. From the same perspective, the average thickness of the titanium carbonitride layer is more preferably from 5.0 μm or more to 15.0 μm or less.

The coating layer of the present embodiment preferably comprises, between the titanium carbonitride layer and the α-type aluminum oxide layer, an intermediate layer comprising a compound of at least one kind selected from the group consisting of a Ti carboxide, a Ti oxynitride and a Ti carboxynitride as this leads to adhesion being further improved. The average thickness of such intermediate layer is preferably from 0.1 μm or more to 1.5 μm or less. If the average thickness of the intermediate layer is 0.1 μm or more, this indicates the tendency of the adhesion to be further improved, and, if such average thickness is 1.5 μm or less, this indicates the tendency of the fracture resistance of the coated cutting tool to be further improved.

The coating layer of the present embodiment preferably comprises a titanium nitride layer, being comprised of titanium nitride, as an outermost layer on a surface of the α-type aluminum oxide layer as this makes it possible to confirm the usage state, such as whether or not the coated cutting tool has been used, thereby leading to excellent visibility. The average thickness of the titanium nitride layer is preferably from 0.2 μm or more to 1.0 μm or less. This is preferable in that: if the average thickness of the titanium nitride layer is 0.2 μm or more, this provides the effect of further suppressing the falling of particles from the α-type aluminum oxide layer; and, if such average thickness is 1.0 μm or less, the fracture resistance of the coated cutting tool is improved.

The coating layer of the present embodiment preferably comprises, between the substrate and the titanium carbonitride layer, a titanium nitride layer, being comprised of titanium nitride, or a titanium carbide layer, being comprised of titanium carbide, which serves as a lowermost layer of the coating layer, as this leads to adhesion being improved. The average thickness of the lowermost layer is preferably from 0.1 μm or more to 0.5 μm or less. If the average thickness of the lowermost layer is 0.1 μm or more, this indicates the tendency of the adhesion to be further improved as the lowermost layer has a more uniform structure. Meanwhile, if the average thickness of the lowermost layer is 0.5 μm or less, this indicates the tendency of the fracture resistance to be further enhanced as the lowermost layer is prevented from serving as a starting point of peeling.

Examples of a method of forming layers that constitute a coating layer in a coated cutting tool according to the present embodiment include the method set forth below. However, such method of forming layers is not limited thereto.

For instance, a titanium nitride layer (hereinafter also referred to as a "TiN layer"), being a layer comprised of titanium nitride, which serves as the outermost layer, can be formed by chemical vapor deposition with a raw material composition of $TiCl_4$: from 5.0 mol % or more to 10.0 mol % or less, $N_2$: from 20 mol % or more to 60 mol % or less, and $H_2$: the balance, a temperature of from 850° C. or higher to 920° C. or lower, and a pressure of from 100 hPa or higher to 400 hPa or lower.

A titanium carbide layer (hereinafter also referred to as a "TiC layer"), being a layer comprised of titanium carbide, which serves as the lowermost layer, can be formed by chemical vapor deposition with a raw material composition of $TiCl_4$: from 2.0 mol % or more to 3.0 mol % or less, $CH_4$: from 4.0 mol % or more to 6.0 mol % or less, and $H_2$: the balance, a temperature of from 980° C. or higher to 1,020° C. or lower, and a pressure of from 60 hPa or higher to 80 hPa or lower.

A titanium carbonitride layer (hereinafter also referred to as a "TiCN" layer), being a layer comprised of titanium carbonitride, can be formed by chemical vapor deposition with a raw material composition of $TiCl_4$: from 8.0 mol % or more to 18.0 mol % or less, $CH_3CN$: from 1.0 mol % or more to 3.0 mol % or less, and $H_2$: the balance, a temperature of from 840° C. or higher to 890° C. or lower, and a pressure of from 60 hPa or higher to 80 hPa or lower.

A TiCNO layer, being comprised of a Ti carboxynitride, can be formed by chemical vapor deposition with a raw material composition of $TiCl_4$: from 3.0 mol % or more to 5.0 mol % or less, CO: from 0.4 mol % or more to 1.0 mol % or less, $N_2$: from 30 mol % or more to 40 mol % or less, and $H_2$: the balance, a temperature of from 975° C. or higher to 1,025° C. or lower, and a pressure of from 90 hPa or higher to 110 hPa or lower.

A TiCO layer, being comprised of a Ti carboxide, can be formed by chemical vapor deposition with a raw material composition of $TiCl_4$: from 0.5 mol % or more to 1.5 mol % or less, CO: from 2.0 mol % or more to 4.0 mol % or less, and $H_2$: the balance, a temperature of from 975° C. or higher to 1,025° C. or lower, and a pressure of from 60 hPa or higher to 100 hPa or lower.

In the present embodiment, an α-type aluminum oxide layer can be formed as set forth below. Firstly, a lowermost layer, a titanium carbonitride layer and an intermediate layer are formed, in this order, on a surface of a substrate. It should be noted that, in the present embodiment, the layers are not necessarily required. Next, when the above layers have been formed, from among such layers, a surface of a layer which is most distant from the substrate is oxidized. Thereafter, a nucleus of an α-type aluminum oxide layer is formed on the surface of the layer which is most distant from the substrate, and an α-type aluminum oxide layer is then formed in the state in which such nucleus has been formed. Further, as needed, a TiN layer may be formed on a surface of the α-type aluminum oxide layer.

More specifically, the oxidation of the surface of the layer which is most distant from the substrate is performed under the conditions of a raw material composition of $CO_2$: from 0.1 mol % or more to 1.0 mol % or less and $H_2$: the balance, a temperature of from 950° C. or higher to 1,000° C. or lower, and a pressure of from 50 hPa or higher to 70 hPa or lower. Here, the oxidation process time is preferably from 5 minutes or more to 10 minutes or less.

The α-type aluminum oxide layer can be formed by chemical vapor deposition with a raw material composition of $AlCl_3$: from 2.1 mol % or more to 5.0 mol % or less, $CO_2$: from 2.5 mol % or more to 4.0 mol % or less, HCl: from 2.0 mol % or more to 3.0 mol % or less, $H_2S$: from 0.28 mol % or more to 0.45 mol % or less, and $H_2$: the balance, a temperature of from 900° C. or higher to 1,000° C. or lower, and a pressure of from 60 hPa or higher to 80 hPa or lower.

A TiN layer, being comprised of titanium nitride, which serves as the outermost layer, can be formed by chemical vapor deposition with a raw material composition of $TiCl_4$: from 5.0 mol % or more to 10.0 mol % or less, $N_2$: from 20 mol % or more to 60 mol % or less, and $H_2$: the balance, a temperature of from 980° C. or higher to 1,020° C. or lower, and a pressure of from 100 hPa or higher to 400 hPa or lower.

In the present embodiment, a coated cutting tool which involves the controlled residual stress value of a coating layer can be obtained by, for example, the method set forth below.

After the formation of the coating layer, a cooling time necessary for the temperature inside an external heating chemical vapor deposition apparatus to reach 300° C. (hereinafter also referred to as a "cooling time") may be adjusted. If the cooling time is reduced, cracking is caused in the intersecting edge, thereby leading to a lower residual stress value in the intersecting edge. This results in the tendency of the residual stress value to increase continuously or stepwise as a measurement position becomes distant from the intersecting edge along the first interface or the second interface. For example, the cooling time can be controlled by adjusting the number of substrates to be placed in the external heating chemical vapor deposition apparatus or by, after the formation of the coating layer, introducing a hydrogen ($H_2$) gas into the external heating chemical vapor deposition apparatus during cooling. More specifically, the cooling time tends to be longer by decreasing the number of substrates to be placed in the external heating chemical vapor deposition apparatus or by, after the formation of the coating layer, increasing a ratio of the $H_2$ gas to be introduced into the external heating chemical vapor deposition apparatus during cooling.

After the formation of the coating layer, dry shot blasting is performed, whereby the residual stress value of the coating layer can be controlled. As to the conditions for dry shot blasting, a shot material may be shot onto the rake surface of the coated cutting tool at a shot pressure of from 0.8 bar or higher to 1.5 bar or lower and for a shot time of from 1.0 second or more to 5.0 seconds or less so as to achieve a shot angle of approximately from 30° or more to 55° or less. The shot material used for dry shot blasting is preferably served by particles of $Al_2O_3$ or $ZrO_2$ with an average particle size of from 100 μm or more to 300 μm or less, and is further preferably served by particles of $ZrO_2$ mixed with a stabilizing agent of MgO, $Y_2O_3$, or the like. There is a tendency that a greater shot angle relative to the rake surface of the coated cutting tool leads to a smaller residual stress value of the first interface. Therefore, it is preferable for the shot angle to be approximately from 50° or more to 55° or less because the residual-stress-value relationship of "Sf>Sr" can be satisfied. Further, Sr and Sf can each be made to fall within a desired numerical range by employing the above-described dry shot blasting condition and cooling time.

The thickness of each layer in the coating layer and the average thickness of the entire coating layer in the coated cutting tool of the present embodiment can be measured by observing a cross-sectional structure of the coated cutting tool, using an optical microscope, a scanning electron microscope (SEM), an FE-SEM, or the like. It should be noted that, as to the average thickness of each layer and the average thickness of the entire coating layer in the coated cutting tool of the present embodiment, each of such average thicknesses can be obtained by: measuring the thickness of each layer or the thickness of the entire coating layer at three or more locations near the position 50 μm from the intersecting edge, toward the center of the rake surface of the coated cutting tool; and calculating the arithmetic mean of the resulting measurements. Further, the composition of each layer can be measured from a cross-sectional structure of the coated cutting tool of the present embodiment, using an energy-dispersive X-ray spectroscope (EDS), a wavelength-dispersive X-ray spectroscope (WDS), or the like.

Examples

Although the present invention will be described in further detail below, with examples, the present invention is not limited to such examples.

A cemented carbide cutting insert with a shape of JIS certified VNMG160408 and a composition of 91.5WC-8.0Co-0.5$Cr_3C_2$ (mass %) was prepared as a substrate. An intersecting edge was formed in the edge of such substrate by means of an SiC brush, and a surface of the substrate was then washed.

After the substrate surface was washed, a coating layer was formed by chemical vapor deposition. As to invention samples 1 to 10, firstly, the substrate was placed in an external heating chemical vapor deposition apparatus. At this time, the number of substrates to be placed in the external heating chemical vapor deposition apparatus was adjusted so as to achieve the cooling time shown in Table 4. Then, a lowermost layer, whose composition is shown in Table 1, was formed on the substrate surface so as to have the average thickness shown in Table 1 under the raw material composition, temperature and pressure conditions shown in Table 2. Then, a titanium carbonitride layer (hereinafter also referred to as a "TiCN layer"), whose composition is shown in Table 1, was formed on the surface of the lowermost layer so as to have the average thickness shown in Table 1 under the raw material composition, temperature and pressure conditions shown in Table 2. Next, an intermediate layer, whose composition is shown in Table 1, was formed on the surface of the TiCN layer so as to have the average thickness shown in Table 1 under the raw material composition, temperature and pressure conditions shown in Table 2. Thereafter, the surface of the intermediate layer was oxidized, using a gas having the composition shown in Table 3, under the temperature and pressure conditions shown in Table 3. At this time, the oxidation process time was set at 5 minutes. Then, an α-type aluminum oxide layer, whose composition is shown in Table 1, was formed on the oxidized surface of the intermediate layer so as to have the average thickness shown in Table 1 under the raw material composition, temperature and pressure conditions shown in Table 2. Lastly, an outermost layer, whose composition is shown in Table 1, was formed on the surface of the α-type aluminum oxide layer so as to have the average thickness shown in Table 1 under the raw material composition, temperature and pressure conditions shown in Table 2. After the formation of the coating layer, the flow rate of an $H_2$ gas to be introduced into the external heating chemical vapor deposition apparatus was adjusted so as to achieve the cooling time shown in Table 4, and the inside of the apparatus was cooled until the temperature reached 300° C. As a result, the coated cutting tools of invention samples 1 to 10 were obtained.

Meanwhile, as to comparative samples 1 to 7, firstly, the substrate was placed in an external heating chemical vapor deposition apparatus. At this time, the number of substrates to be placed in the external heating chemical vapor deposition apparatus was adjusted so as to achieve the cooling time shown in Table 4. Then, a lowermost layer, whose composition is shown in Table 1, was formed on the substrate surface so as to have the average thickness shown in Table 1 under the raw material composition, temperature and pressure conditions shown in Table 2. Then, a TiCN layer, whose composition is shown in Table 1, was formed on the surface of the lowermost layer so as to have the average thickness shown in Table 1 under the raw material composition, temperature and pressure conditions shown in Table 2. Next, an intermediate layer, whose composition is shown in Table 1, was formed on the surface of the TiCN layer so as to have the average thickness shown in Table 1 under the raw material composition, temperature and pressure conditions shown in Table 2. Thereafter, the surface of the intermediate layer was oxidized, using a gas having the composition shown in Table 3, under the temperature and pressure conditions shown in Table 3. At this time, the oxidation process time was set at 5 minutes. Then, an α-type aluminum oxide layer, whose composition is shown in Table 1, was formed on the oxidized surface of the intermediate layer so as to have the average thickness shown in Table 1 under the raw material composition, temperature and pressure conditions shown in Table 2. Lastly, an outermost layer, whose composition is shown in Table 1, was formed on the surface of the α-type aluminum oxide layer so as to have the average thickness shown in Table 1 under the raw material composition, temperature and pressure conditions shown in Table 2. After the formation of the coating layer, the flow rate of an $H_2$ gas to be introduced into the external heating chemical vapor deposition apparatus was adjusted so as to achieve the cooling time shown in Table 4, and the inside of the apparatus was cooled until the temperature reached 300° C. As a result, the coated cutting tools of comparative samples 1 to 7 were obtained.

The thickness of each layer of each of the samples was obtained as set forth below. That is, using an FE-SEM, the average thickness was obtained by: measuring the thickness of each layer, from each of the cross-sectional surfaces at three locations near the position 50 μm from the intersecting edge of the coated cutting tool, toward the center of the rake surface thereof; and calculating the arithmetic mean of the resulting measurements. Using an EDS, the composition of each layer of the obtained sample was measured from the cross-sectional surface near the position at most 50 μm from the intersecting edge of the coated cutting tool, toward the center of the rake surface thereof.

TABLE 1

| | Coating layer | | | | | | | | | |
|---|---|---|---|---|---|---|---|---|---|---|
| | Lowermost layer | | TiCN layer | | Intermediate layer | | α-type aluminum oxide layer | | Outermost layer | | |
| Sample No. | Composition | Average thickness (μm) | Composition | Average thickness (μm) | Composition | Average thickness (μm) | Crystal system | Average thickness (μm) | Composition | Average thickness (μm) | Total thickness (μm) |
| Invention sample 1 | TiN | 0.1 | TiCN | 6.8 | TiCNO | 0.3 | α | 7.8 | TiN | 0.4 | 15.4 |
| Invention sample 2 | TiN | 0.3 | TiCN | 10.2 | TiCNO | 0.3 | α | 4.4 | TiN | 0.5 | 15.7 |
| Invention sample 3 | TiN | 0.1 | TiCN | 7.2 | TiCNO | 0.1 | α | 9.2 | TiN | 0.3 | 16.9 |
| Invention sample 4 | TiN | 0.1 | TiCN | 10.0 | TiCO | 0.1 | α | 9.2 | TiN | 0.5 | 19.9 |
| Invention sample 5 | TiN | 0.5 | TiCN | 18.8 | TiCNO | 0.5 | α | 4.4 | TiN | 0.2 | 24.4 |
| Invention sample 6 | TiN | 0.3 | TiCN | 7.4 | TiCNO | 0.3 | α | 10.0 | TiN | 0.3 | 18.3 |
| Invention sample 7 | TiN | 0.3 | TiCN | 4.0 | TiCNO | 0.5 | α | 9.0 | TiN | 0.2 | 14.0 |
| Invention sample 8 | TiC | 0.3 | TiCN | 5.6 | TiCNO | 0.5 | α | 3.2 | TiN | 0.5 | 10.1 |
| Invention sample 9 | TiN | 0.1 | TiCN | 3.0 | TiCNO | 0.1 | α | 15.4 | TiN | 0.6 | 19.2 |
| Invention sample 10 | TiN | 1.0 | TiCN | 4.0 | TiCO | 1.0 | α | 4.6 | TiN | 1.5 | 12.1 |
| Comparative sample 1 | TiN | 0.1 | TiCN | 9.8 | TiCO | 0.1 | α | 9.0 | TiN | 0.2 | 19.2 |
| Comparative sample 2 | TiN | 0.3 | TiCN | 4.4 | TiCO | 0.5 | α | 3.0 | TiN | 0.6 | 8.8 |
| Comparative sample 3 | TiN | 0.5 | TiCN | 7.6 | TiCNO | 0.5 | α | 4.8 | TiN | 0.2 | 13.6 |
| Comparative sample 4 | TiN | 0.1 | TiCN | 8.6 | TiCNO | 0.3 | α | 7.8 | TiN | 0.4 | 17.2 |
| Comparative sample 5 | TiN | 0.3 | TiCN | 10.2 | TiCNO | 1.0 | α | 10.0 | TiN | 1.5 | 23.0 |
| Comparative sample 6 | TiN | 0.5 | TiCN | 10.2 | TiCNO | 0.5 | α | 4.4 | TiN | 0.4 | 16.0 |
| Comparative sample 7 | TiN | 1.0 | TiCN | 7.2 | TiCNO | 0.1 | α | 10.2 | TiN | 0.2 | 18.7 |

TABLE 2

| Each layer composition | Temperature (° C.) | Pressure (hPa) | Raw material composition (mol %) |
|---|---|---|---|
| TiN (lowermost layer) | 900 | 350 | $TiCl_4$: 7.5%, $N_2$: 40.0%, $H_2$: 52.5% |
| TiC (lowermost layer) | 1,000 | 75 | $TiCl_4$: 2.4%, $CH_4$: 4.6%, $H_2$: 93.0% |
| TiCN (TiCN layer) | 840 | 70 | $TiCl_4$: 12.0%, $CH_3CN$: 2.0%, $H_2$: 86.0% |
| TiCNO (intermediate layer) | 1,000 | 100 | $TiCl_4$: 3.5%, CO: 0.7%, $N_2$: 35.5%, $H_2$: 60.3% |
| TiCO (intermediate layer) | 1,000 | 80 | $TiCl_4$: 1.3%, CO: 2.7%, $H_2$: 96.0% |
| α-type $Al_2O_3$ (α-type $Al_2O_3$ layer) | 1,000 | 70 | $AlCl_3$: 2.5%, $CO_2$: 3.0%, HCl: 2.3%, $H_2S$: 0.35%, $H_2$: 91.85% |
| TiN (outermost layer) | 1,000 | 350 | $TiCl_4$: 7.5%, $N_2$: 40.0%, $H_2$: 52.5% |

TABLE 3

| | Temperature (° C.) | Pressure (hPa) | Composition (mol %) |
|---|---|---|---|
| Oxidation process | 960 | 70 | $CO_2$: 0.5%, $H_2$: 99.5% |

TABLE 4

| Sample No. | Cooling time (min) |
|---|---|
| Invention sample 1 | 80 |
| Invention sample 2 | 80 |
| Invention sample 3 | 100 |
| Invention sample 4 | 100 |
| Invention sample 5 | 100 |
| Invention sample 6 | 100 |
| Invention sample 7 | 120 |
| Invention sample 8 | 80 |
| Invention sample 9 | 100 |
| Invention sample 10 | 80 |
| Comparative sample 1 | 140 |
| Comparative sample 2 | 140 |
| Comparative sample 3 | 100 |
| Comparative sample 4 | 140 |
| Comparative sample 5 | 140 |
| Comparative sample 6 | 100 |
| Comparative sample 7 | 120 |

As to invention samples 1 to 10 and comparative samples 1 to 7, after the formation of the coating layer on the surface of the substrate, dry shot blasting was performed on a surface of the coating layer under the shot conditions shown in Table 5, using the shot material shown in Table 5. It should be noted that the numerical values "0, 90" in the "Shot angle relative to rake surface" column indicate that dry shot blasting was performed once for each of the respective shot angles of 0° and 90°.

TABLE 5

| | Shot material | | Shot conditions | | |
|---|---|---|---|---|---|
| Sample No. | Material | Average particle size (μm) | Shot angle (°) relative to rake surface | Shot pressure (bar) | Shot time (sec) |
| Invention sample 1 | $ZrO_2$ | 250 | 55 | 1.5 | 3.0 |
| Invention sample 2 | $ZrO_2$ | 250 | 55 | 1.2 | 2.0 |
| Invention sample 3 | $Al_2O_3$ | 300 | 55 | 1.5 | 4.0 |
| Invention sample 4 | $Al_2O_3$ | 100 | 55 | 0.8 | 2.0 |
| Invention sample 5 | $Al_2O_3$ | 250 | 30 | 1.2 | 3.0 |
| Invention sample 6 | $ZrO_2$ | 300 | 55 | 1.5 | 4.0 |
| Invention sample 7 | $Al_2O_3$ | 200 | 30 | 1.2 | 3.0 |
| Invention sample 8 | $Al_2O_3$ | 150 | 55 | 1.2 | 2.0 |
| Invention sample 9 | $Al_2O_3$ | 200 | 55 | 1.2 | 3.0 |
| Invention sample 10 | $Al_2O_3$ | 150 | 55 | 0.8 | 2.0 |
| Comparative sample 1 | $Al_2O_3$ | 80 | 0 | 0.8 | 1.0 |
| Comparative sample 2 | $Al_2O_3$ | 150 | 0, 90 | 1.2 | 2.0 |
| Comparative sample 3 | $Al_2O_3$ | 150 | 0, 90 | 1.2 | 1.0 |
| Comparative sample 4 | $Al_2O_3$ | 100 | 0, 90 | 0.8 | 2.0 |
| Comparative sample 5 | $Al_2O_3$ | 200 | 15 | 1.2 | 3.0 |
| Comparative sample 6 | $ZrO_2$ | 200 | 75 | 1.2 | 2.0 |
| Comparative sample 7 | $ZrO_2$ | 250 | 0, 90 | 1.5 | 3.0 |

Figure 2:
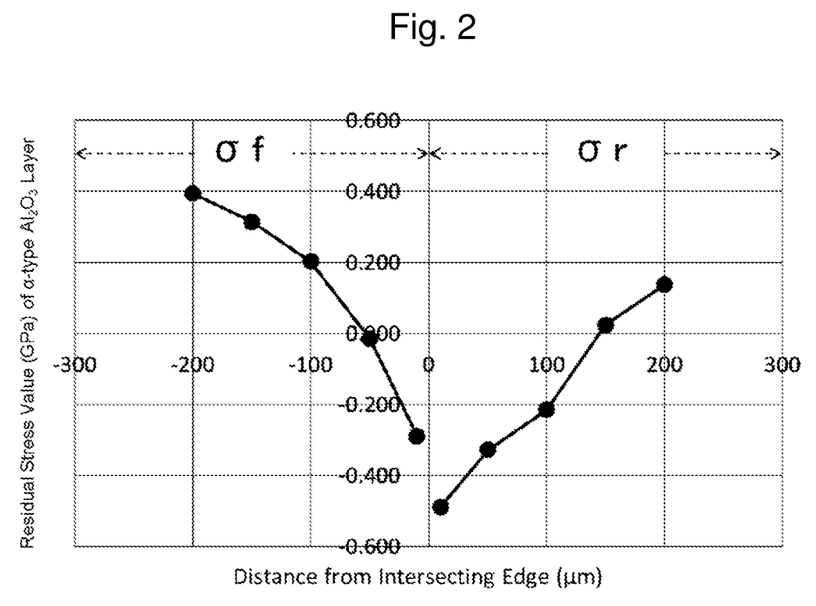
FIG. 2 is a graph showing measurement results of residual stress values in the α-type aluminum oxide layer of invention sample 2.

The residual stress values at respective positions in the α-type aluminum oxide layer of the present embodiment were measured by a 2D method (a multi-axial stress measurement method/a full Debye ring fitting method). The measurement of residual stress values of the α-type aluminum oxide layer employed a peak intensity for a (116) plane in X-ray diffraction. As to the conditions for X-ray diffraction measurement, Cu-Kα radiation with 0.05 mmϕ was used as a radiation source for X-rays, radiation was performed under the condition of an output of 50 kV, 1.0 mA, whereby residual stress values were measured. Each of the residual stress values was obtained by measuring the α-type aluminum oxide layer at a position at most 200 μm from the intersecting edge along the first interface or the second interface. At this time, the residual stress values at respective measurement positions 10 μm, 50 μm, 100 μm, 150 μm and 200 μm from the intersecting edge were measured by the 2D method. Each residual stress value was calculated as the arithmetic mean of the residual stresses at three points. Herein, a residual stress value in a direction parallel to the intersecting edge was regarded as the residual stress value of the α-type aluminum oxide layer. The measurement results are shown in Table 6. Further, the relationship between residual stress values and the forms of residual stress values were obtained from the resulting measurements. The measurement results are shown in Table 7. Herein, in the table, the term "σr and σf: increase continuously" in the "Types of residual stress values σr and σf" column indicates that: the residual stress value σr of the α-type aluminum oxide layer increases continuously as the measurement position becomes distant from the intersecting edge; and the residual stress value σf of the α-type aluminum oxide layer also increases continuously as the measurement position becomes distant from the intersecting edge. Similarly, the terms "σr: constant" and "σf: constant" each indicate that the residual stress value σr or σf of the α-type aluminum oxide layer is constant, and the terms "σr: stepwise increase" and "σf: stepwise increase" each indicate that the residual stress value σr or σf of the α-type aluminum oxide layer increases stepwise. Further, FIG. 2 shows the measurement results of residual stress values in the α-type aluminum oxide layer of invention sample 2.

TABLE 6

Residual stress values (GPa) σr and σf of α-type aluminum oxide layer

| | σf measured at position separated from intersecting edge along second interface for each distance | | | | | σr measured at position separated from intersecting edge along first interface for each distance | | | | |
|---|---|---|---|---|---|---|---|---|---|---|
| | Sf | | | | | Sr | | | | |
| Sample No. | 200 μm | 150 μm | 100 μm | 50 μm | 10 μm | 10 μm | 50 μm | 100 μm | 150 μm | 200 μm |
| Invention sample 1 | 0.302 | 0.289 | 0.136 | 0.055 | −0.341 | −0.567 | −0.344 | −0.167 | 0.069 | 0.152 |
| Invention sample 2 | 0.394 | 0.315 | 0.203 | −0.015 | −0.289 | −0.489 | −0.328 | −0.215 | 0.024 | 0.138 |
| Invention sample 3 | −0.397 | −0.422 | −0.564 | −0.689 | −0.794 | −0.865 | −0.812 | −0.779 | −0.701 | −0.613 |
| Invention sample 4 | 0.478 | 0.427 | 0.385 | 0.299 | 0.208 | 0.135 | 0.198 | 0.246 | 0.387 | 0.450 |
| Invention sample 5 | 0.288 | 0.175 | −0.146 | −0.316 | −0.505 | −0.441 | −0.207 | −0.032 | 0.190 | 0.313 |
| Invention sample 6 | −0.440 | −0.602 | −0.720 | −0.875 | −0.976 | −1.007 | −0.935 | −0.824 | −0.689 | −0.497 |
| Invention sample 7 | −0.060 | −0.134 | −0.205 | −0.252 | −0.319 | −0.259 | −0.142 | −0.065 | 0.124 | 0.225 |
| Invention sample 8 | 0.487 | 0.464 | 0.320 | 0.116 | −0.087 | −0.105 | 0.049 | 0.237 | 0.366 | 0.421 |
| Invention sample 9 | 0.268 | 0.103 | −0.048 | −0.277 | −0.298 | −0.421 | −0.215 | −0.187 | −0.006 | 0.169 |
| Invention sample 10 | 0.540 | 0.514 | 0.498 | 0.310 | 0.156 | 0.124 | 0.176 | 0.410 | 0.452 | 0.474 |
| Comparative sample 1 | 0.270 | 0.275 | 0.318 | 0.289 | 0.304 | 0.364 | 0.422 | 0.470 | 0.506 | 0.510 |
| Comparative sample 2 | −0.036 | −0.068 | −0.046 | −0.027 | −0.057 | −0.036 | −0.084 | −0.055 | −0.072 | −0.044 |
| Comparative sample 3 | 0.456 | 0.430 | 0.378 | 0.296 | 0.156 | 0.139 | 0.110 | 0.144 | 0.098 | 0.135 |
| Comparative sample 4 | 0.210 | 0.197 | 0.175 | 0.213 | 0.140 | 0.218 | 0.232 | 0.185 | 0.168 | 0.208 |
| Comparative sample 5 | −0.248 | −0.235 | −0.217 | −0.272 | −0.247 | −0.265 | −0.184 | −0.108 | 0.022 | 0.080 |
| Comparative sample 6 | 0.234 | 0.206 | −0.032 | −0.184 | −0.298 | −0.316 | −0.334 | −0.287 | −0.338 | −0.350 |
| Comparative sample 7 | −0.987 | −1.098 | −1.011 | −0.954 | −1.079 | −1.042 | −1.107 | −1.029 | −0.995 | −1.030 |

TABLE 7

| Sample No. | Relationship between residual stress values of α-type aluminum oxide layer | Types of residual stress values σf and σr of α-type aluminum oxide layer |
|---|---|---|
| Invention sample 1 | Sf > Sr | σf: stepwise increase<br>σr: continuous increase |
| Invention sample 2 | Sf > Sr | σf and σr: continuous increase |
| Invention sample 3 | Sf > Sr | σf and σr: continuous increase |
| Invention sample 4 | Sf > Sr | σf and σr: continuous increase |
| Invention sample 5 | Sr > Sf | σf and σr: continuous increase |
| Invention sample 6 | Sf > Sr | σf and σr: continuous increase |
| Invention sample 7 | Sr > Sf | σf and σr: continuous increase |
| Invention sample 8 | Sf > Sr | σf and σr: continuous increase |
| Invention sample 9 | Sf > Sr | σf and σr: continuous increase |
| Invention sample 10 | Sf > Sr | σf: stepwise increase<br>σr: continuous increase |
| Comparative sample 1 | Sr > Sf | σf: constant<br>σr: continuous increase |
| Comparative sample 2 | Sf > Sr | σf: constant<br>σr: constant |
| Comparative sample 3 | Sf > Sr | σf: continuous increase<br>σr: constant |
| Comparative sample 4 | Sr > Sf | σf: constant<br>σr: constant |
| Comparative sample 5 | Sr > Sf | σf: constant<br>σr: continuous increase |
| Comparative sample 6 | Sf > Sr | σf: continuous increase<br>σr: constant |
| Comparative sample 7 | Sf > Sr | σf: constant<br>σr: constant |

Cutting tests 1 and 2 were conducted using the obtained samples, i.e., invention samples 1 to 10 and comparative samples 1 to 7, under the following conditions. Cutting test 1 is a wear test for evaluating wear resistance, and cutting test 2 is a fracture test for evaluating fracture resistance. The results of the respective cutting tests are shown in Table 8.

[Cutting Test 1]
Workpiece material: S45C round bar
Cutting speed: 290 m/min
Feed: 0.25 mm/rev
Depth of cut: 1.8 mm
Coolant: used
Evaluation items: A time when a sample was fractured or had a maximum flank wear width of 0.2 mm was defined as the end of the tool life, and the machining time to reach the end of the tool life was measured. It should be noted that, when a sample had a maximum flank wear width of 0.2 mm before the fracturing, this was evaluated as "normal wear," and when a sample was fractured, this was evaluated as "fracturing."

[Cutting Test 2]
Workpiece material: SCM415 round bar with two equidistant grooves extending in the length direction
Cutting speed: 170 m/min
Feed: 0.30 mm/rev
Depth of cut: 1.7 mm
Coolant: used
Evaluation items: A time when a sample was fractured was defined as the end of the tool life, and the number of shocks the sample had received until the end of the tool life was measured. The number of times the sample and the workpiece material were brought into contact with each other was defined as the number of shocks, and the test was ended when the sample was fractured. It should be noted that, as to each sample, five inserts were prepared and the number of shocks was measured for each of such cutting inserts, and the arithmetic mean was obtained from the measurements of the number of shocks so as to serve as the tool life.

As to the machining time to reach the end of the tool life in cutting test 1 (wear test), evaluations were made with grade "A" for 20 minutes or more, grade "B" for 15 minutes or more and less than 20 minutes, and grade "C" for less than 15 minutes. Further, as to the number of shocks until the end of the tool life in cutting test 2 (fracture test), evaluations were made with grade "A" for 10,000 or more, grade "B" for 5,000 or more and less than 10,000, and grade "C" for less than 5,000. In such evaluations, "A" refers to excellent, "B" refers to good and "C" refers to inferior, meaning that a sample involving a larger number of "A"s or "B"s has more excellent cutting performance. The evaluation results are shown in Table 8.

TABLE 8

| | Cutting test 1 | | | Cutting test 2 | |
|---|---|---|---|---|---|
| Sample No. | Tool life (min) | Grade | Damage form | Tool life (shocks) | Grade |
| Invention sample 1 | 21 | A | Normal wear | 14,900 | A |
| Invention sample 2 | 21 | A | Normal wear | 14,200 | A |
| Invention sample 3 | 22 | A | Normal wear | 13,900 | A |
| Invention sample 4 | 24 | A | Normal wear | 13,000 | A |
| Invention sample 5 | 19 | B | Normal wear | 10,800 | A |
| Invention sample 6 | 15 | B | Normal wear | 11,800 | A |
| Invention sample 7 | 17 | B | Normal wear | 11,900 | A |
| Invention sample 8 | 16 | B | Normal wear | 12,600 | A |
| Invention sample 9 | 19 | B | Normal wear | 10,500 | A |
| Invention sample 10 | 15 | B | Normal wear | 12,100 | A |
| Comparative sample 1 | 11 | C | Fracturing | 3,600 | C |
| Comparative sample 2 | 9 | C | Fracturing | 5,500 | B |
| Comparative sample 3 | 13 | C | Normal wear | 9,400 | B |
| Comparative sample 4 | 16 | B | Fracturing | 4,500 | C |
| Comparative sample 5 | 18 | B | Fracturing | 5,200 | B |
| Comparative sample 6 | 16 | B | Normal wear | 8,700 | B |
| Comparative sample 7 | 17 | B | Normal wear | 4,300 | C |

The results of Table 8 show that each invention sample had grade "B" or higher in the wear test and also show that each invention sample had grade "A" in the fracture test. Meanwhile, as to the evaluations on the comparative samples, each comparative sample had grade "B" or lower in the wear test and also had grade "B" or lower in the fracture test. Accordingly, it is apparent that the wear resistance of each invention sample is equal to or better than that of each comparative sample and that the fracture resistance of each invention sample is more excellent than that of each comparative sample.

It is apparent from the above results that each invention sample has excellent wear resistance and fracture resistance, thereby resulting in a longer tool life.

The present application is based on the Japanese patent application filed on Apr. 21, 2017 (JP Appl. 2017-084074), the content of which is incorporated herein by reference.

INDUSTRIAL APPLICABILITY

As to a coated cutting tool according to the present invention, such coated cutting tool does not involve a reduction in wear resistance and has excellent fracture resistance, so that the tool life can be extended more than that involved in the prior art, and, from such perspective, the coated cutting tool has industrial applicability.

REFERENCE SIGNS LIST

1: Substrate, 2: Lowermost layer, 3: Titanium carbonitride layer, 4: Intermediate layer, 5: α-type aluminum oxide layer, 6: Outermost layer, 7: Coating layer, 8: Coated cutting tool.

What is claimed is:
1. A coated cutting tool comprising a substrate and a coating layer formed on a surface of the substrate, the coated cutting tool having a rake surface and a flank, in which the coating layer includes an α-type aluminum oxide layer, wherein:
the α-type aluminum oxide layer has, on an opposite side to the substrate, a first interface, being the rake surface or a surface substantially parallel to the rake surface, a second interface, being the flank or a surface substantially parallel to the flank, and an intersecting edge between the first interface and the second interface; and
the α-type aluminum oxide layer further satisfies conditions represented by formulae (1) and (2) below
(1) A residual stress value σr (unit: GPa) measured in the α-type aluminum oxide layer increases continuously or stepwise as a measurement position becomes distant from the intersecting edge along the first interface with distances of 10 μm, 50 μm, 100 μm, 150 μm and 200 μm; and
(2) A residual stress value σf (unit: GPa) measured in the α-type aluminum oxide layer increases continuously or stepwise as a measurement position becomes distant from the intersecting edge along the second interface with distances of 10 μm, 50 μm, 100 μm, 150 μm and 200 μm.

2. The coated cutting tool according to claim 1, wherein the α-type aluminum oxide layer satisfies a condition represented by formula (A) below $$Sf > Sr \tag{A}$$

In the formula above, Sf denotes a residual stress value (unit: GPa) measured, in the α-type aluminum oxide layer, at a position 100 μm from the intersecting edge along the second interface, and Sr denotes a residual stress value (unit: GPa) measured, in the α-type aluminum oxide layer, at a position 100 μm from the intersecting edge along the first interface.

3. The coated cutting tool according to claim 1, wherein the α-type aluminum oxide layer satisfies a condition represented by formula (B) below $$-0.800 \leq Sr \leq 0.300 \tag{B}$$

(In the formula above, Sr denotes a residual stress value (unit: GPa) measured, in the α-type aluminum oxide layer, at a position 100 μm from the intersecting edge along the first interface.

4. The coated cutting tool according to claim 1, wherein the α-type aluminum oxide layer satisfies a condition represented by formula (C) below $$-0.600 \leq Sf \leq 0.400 \tag{C}$$

(In the formula above, Sf denotes a residual stress value (unit: GPa) measured, in the α-type aluminum oxide layer, at a position 100 μm from the intersecting edge along the second interface.

5. The coated cutting tool according to claim 1, wherein an average thickness of the α-type aluminum oxide layer is from 1.0 μm or more to 15.0 μm or less.

6. The coated cutting tool according to claim 1, wherein:
the coating layer comprises a titanium carbonitride layer, being comprised of titanium carbonitride, between the substrate and the α-type aluminum oxide layer; and
an average thickness of the titanium carbonitride layer is from 1.0 μm or more to 20.0 μm or less.

7. The coated cutting tool according to claim 6, wherein the coating layer comprises, between the titanium carbonitride layer and the α-type aluminum oxide layer, an intermediate layer comprising a compound of at least one kind selected from the group consisting of a Ti carboxide, a Ti oxynitride and a Ti carboxynitride.

8. The coated cutting tool according to claim 7, wherein an average thickness of the intermediate layer is from 0.1 μm or more to 1.5 μm or less.

9. The coated cutting tool according to claim 1, wherein an average thickness of the coating layer is from 3.0 μm or more to 30.0 μm or less.

10. The coated cutting tool according to claim 1, wherein:
the coating layer comprises a titanium nitride layer, being comprised of titanium nitride, as an outermost layer on a surface of the α-type aluminum oxide layer; and
an average thickness of the outermost layer is from 0.1 μm or more to 1.0 μm or less.

11. The coated cutting tool according to claim 1, wherein the substrate is any of a cemented carbide, cermet, ceramics and a sintered body containing cubic boron nitride.

12. The coated cutting tool according to claim 2, wherein the α-type aluminum oxide layer satisfies a condition represented by formula (B) below $$-0.800 \leq Sr \leq 0.300 \tag{B}$$

(In the formula above, Sr denotes a residual stress value (unit: GPa) measured, in the α-type aluminum oxide layer, at a position 100 μm from the intersecting edge along the first interface).

13. The coated cutting tool according to claim 2, wherein the α-type aluminum oxide layer satisfies a condition represented by formula (C) below $$-0.600 \leq Sf \leq 0.400 \tag{C}$$

(In the formula above, Sf denotes a residual stress value (unit: GPa) measured, in the α-type aluminum oxide layer, at a position 100 μm from the intersecting edge along the second interface).

14. The coated cutting tool according to claim 3, wherein the α-type aluminum oxide layer satisfies a condition represented by formula (C) below $$-0.600 \leq Sf \leq 0.400 \tag{C}$$

(In the formula above, Sf denotes a residual stress value (unit: GPa) measured, in the α-type aluminum oxide layer, at a position 100 μm from the intersecting edge along the second interface).

15. The coated cutting tool according to claim 2, wherein an average thickness of the α-type aluminum oxide layer is from 1.0 μm or more to 15.0 μm or less.

16. The coated cutting tool according to claim 2, wherein an average thickness of the α-type aluminum oxide layer is from 1.0 μm or more to 15.0 μm or less.

17. The coated cutting tool according to claim 3, wherein an average thickness of the α-type aluminum oxide layer is from 1.0 μm or more to 15.0 μm or less.

18. The coated cutting tool according to claim 2, wherein:
the coating layer comprises a titanium carbonitride layer, being comprised of titanium carbonitride, between the substrate and the α-type aluminum oxide layer; and
an average thickness of the titanium carbonitride layer is from 1.0 μm or more to 20.0 μm or less.

19. The coated cutting tool according to claim 3, wherein:
the coating layer comprises a titanium carbonitride layer, being comprised of titanium carbonitride, between the substrate and the α-type aluminum oxide layer; and
an average thickness of the titanium carbonitride layer is from 1.0 μm or more to 20.0 μm or less.

20. The coated cutting tool according to claim 1, wherein the α-type aluminum oxide layer satisfies a condition represented by formula (B) below $$-0.700 \leq Sr \leq -0.100 \tag{B}$$

(In the formula above, Sr denotes a residual stress value (unit: GPa) measured, in the α-type aluminum oxide layer, at a position 100 μm from the intersecting edge along the first interface).

* * * * *